United States Patent [19]

Fotino

[11] 4,399,360
[45] Aug. 16, 1983

[54] TRANSMISSION ELECTRON MICROSCOPE EMPLOYING SEQUENTIAL PIXEL ACQUISTION FOR DISPLAY

[75] Inventor: Mircea Fotino, Boulder, Colo.

[73] Assignee: University Patents, Inc., Norwalk, Conn.

[21] Appl. No.: 364,353

[22] Filed: Apr. 2, 1982

Related U.S. Application Data

[63] Continuation of Ser. No. 176,325, Aug. 8, 1980, abandoned.

[51] Int. Cl.³ ............................................ G01N 23/00
[52] U.S. Cl. .................................... 250/311; 250/397
[58] Field of Search ............... 250/306, 307, 311, 397, 250/398

[56] References Cited

U.S. PATENT DOCUMENTS

| | | | |
|---|---|---|---|
| 2,372,422 | 3/1945 | Hillier | 250/397 |
| 3,191,028 | 6/1965 | Crewe | 250/311 |
| 3,795,809 | 3/1974 | Takashima | 250/397 |
| 4,044,254 | 8/1977 | Krisch et al. | 250/311 |
| 4,316,087 | 2/1982 | Yanaka et al. | 250/311 |

Primary Examiner—Bruce C. Anderson
Attorney, Agent, or Firm—David N. Koffsky; A. Sidney Alpert

[57] ABSTRACT

A standard Transmission Electron Microscope is modified to include electrostatic deflection plates for deflecting the image of the specimen across an aperture plate. The electrons passing through the aperture plate are detected and converted into image pixels for either instantaneous display or for further conversion into digital form for subsequent storage of the image.

6 Claims, 1 Drawing Figure

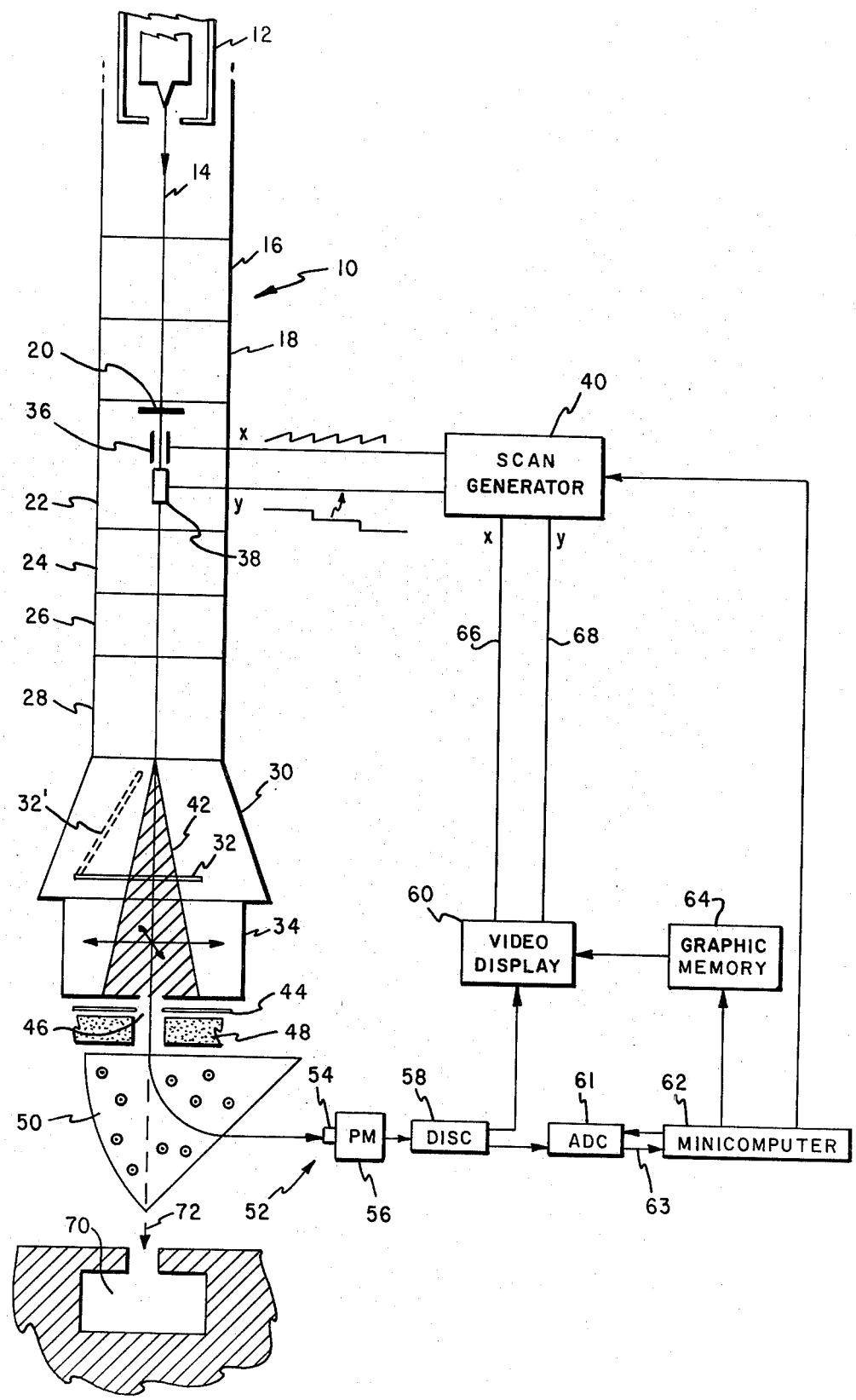

TRANSMISSION ELECTRON MICROSCOPE EMPLOYING SEQUENTIAL PIXEL ACQUISTION FOR DISPLAY

This application is a continuation of our prior U.S. application, Ser. No. 176,325, filed on Aug. 8, 1980 abandoned.

BACKGROUND OF THE INVENTION (1) Field of the Invention

This invention relates generally to transmission electron microscopes (TEM) and more particularly to means within a TEM for providing improved images of specimens.

(2) Description of the Prior Art

In a conventional TEM, the illuminating beam penetrates a given specimen area and is then focused by the lens system into a magnified image. To view such image requires the help of a mechanism by which the electron beam intensity in each picture element (pixel) can be optically perceived. Because of convenience and reduced cost, the conversion to an optical image for observation is usually accomplished by a fluorescent substance—such as cadmium or zinc oxide. These oxides are spread in a thin layer onto a support to form the viewing screen. This passive mode of visualization, while widely adopted—for lack of better alternatives—presents a number of limitations:

(a) the graininess of the fluorescent phosphor and diffusion of emitted light within the screen restricts high resolution observations to levels considerably poorer than achieved with photographic emulsions;

(b) the mechanism of light emission by electrons from current fluorescent substances is not very efficient, thus requiring substantial beam intensities for bringing screen images above perception thresholds. Especially when working at high magnifications and in the case of delicate biological preparations, this requirement is restricted by the damage induced in the specimen by the electron beam;

(c) as a consequence of electron interaction with the specimen, the effectiveness and contrast displayed by fluorescent screens decrease progressively when the electron energy increases; and (d) poor screen visibility makes direct, high resolution focusing difficult at either high or low magnifications and thus leads to more than minimal specimen damage through prolonged radiation.

Thus, from what has been above-mentioned, the main difficulty in viewing and/or recording images, particularly in high voltage transmission electron microscopy, stems from the unavoidable fact that the pixels cannot yield information independently of each other because of crosstalk between neighboring elements produced by single or multiple scattering and by more copious radiative processes that affect the detectors (e.g., fluorescent phosphors).

More efficient alternatives to this mechanism aimed at eliminating some of the existing difficulties by taking advantage of the advanced electronic technology have been attempted and developed to various degrees of performance and satisfaction. For instance, image intensifiers have been used in which the global image is divided into a multitude of pixels which are detected and amplified individually and simultaneously for display on a final screen. However, since an intermediate screen image is still needed for the image intensification to be performed, most of the limitations described above are not avoided, and the overall performance remains relatively unsatisfactory. In addition, since existing image intensifiers are both delicate and sensitive to X rays, they cannot be placed directly in the electron beam because of radiation damage and high x-ray background smearing of whatever resolution might otherwise be available.

Several other types of electron microscopes are well-known in the art and, to a certain extent, avoid some of the above problems inherent in TEMs. The scanning electron microscope (SEM) employs an electron pencil beam which is focused on the specimen and is provided with an image detector which senses secondary electron emission from the surface of the specimen. Scanning transmission electron microscopes (STEM) employ a pencil beam which is swept across the specimen with the signal being obtained below the specimen. Not only is it difficult to keep STEM beams stable and properly oriented, but such beams have a propensity to severely damage the specimens being examined.

Examples of such microscope systems are shown in U.S. Pat. Nos. Re. 39,500 to Hoppe; 4,044,254 and '255 to Krisch, et al.

It is an object of this invention to provide a TEM with an improved imaging system that enables pixel data to be collected directly from beam intensities without intermediate conversions to visible images and free of contrast-limiting pixel interaction.

It is another object of this invention to provide an improved TEM imaging system wherein a direct specimen transmission profile can be exhibited on a Cathode Ray Tube monitor.

It is also an object of this invention to provide an improved TEM imaging system wherein pixel data for global two dimensional images can be obtained directly in digital form for instant storage or manipulation.

Still another object of this invention is to provide a TEM with the means for sequentially acquiring the image of a specimen in addition to its standard image acquisition capability by which all pixels are recorded at once.

It is still a further object of this invention to provide an improved TEM imaging system which can be added to a conventional TEM without significant redesign.

SUMMARY OF THE INVENTION

The above and other objects of the invention are achieved in a TEM by displacing, through the use of electric fields, the entire and undistorted electron beam after interaction with a specimen, so that the complete image is swept in a two dimensional orthogonal raster across a stationary detector. Pixels are created by detecting the image as it is swept across an aperture beneath the image plane, which aperture basically defines the essential limits and content of the pixel. Electrons passing through the aperture are deflected to a high efficiency electron detector which provides a voltage output indicative of the sensed signal. Pixels can be directly imaged onto a CRT whose sweep is synchronized with the deflection generator used to sweep the image across the pixel aperture.

These and other features of the invention will be described in greater detail in the following detailed description.

BRIEF DESCRIPTION OF THE DRAWING

The FIGURE is a schematic illustration of a transmission electron microscope which has been modified in accordance with the present invention.

DETAILED DESCRIPTION

Referring now to the FIGURE, TEM 10 is schematically shown and has been modified in accordance with the invention. Electron source 12 produces an electron beam 14 which is directed through condenser lens chamber 16 and specimen chamber 18 to specimen 20. After passing through specimen 20, the electron beam continues through objective lens chamber 22, diffraction lens chamber 24, intermediate lens chamber 26, projector lens chamber 28, and finally into viewing chamber 30. As is conventional in TEMs, the aforementioned lens chambers greatly magnify and project electron beam 14 in the form of beam envelope 42 onto observation screen 32 for normal viewing. Observation screen 32 may be tilted as shown at 32' thereby allowing the projected image to enter camera chamber 34.

TEM 10 has been modified in a number of areas to accommodate the invention herein described. Within objective lens chamber 22, two pairs of x and y electrostatic deflection plates 36 and 38 have been installed below the pole piece of the objective lens (not shown) and beneath specimen 20. Each of deflection plates 36 and 38 is connected to the respective x and y outputs of scan generator 40 which provides x and y deflection voltages to the plates. Scan generator 40 provides a TV-type raster scan excitation to plates 36 and 38 for the purpose of causing beam envelope 42 to sweep in both the x and y coordinates across aperture plate 44 which is placed immediately below an opening in camera chamber 34.

It has been found that only very small voltage variations need be applied to deflection plates 36 and 38 to achieve multicentimeter deflections of beam envelope 42 across aperture plate 44. For instance, in the prototype TEM modified as taught herein, only several volts are required at magnifications of 100,000× for image displacements of several centimeters. This is because only a small fraction of the total displacement desired of the final image needs be generated at the deflection plate (within the objective lens chamber) because the image undergoes subsequent magnification in other lenses. Thus, the lateral displacement of electron beam 14 is accomplished with very modest fields and limited circuitry.

As the beam envelope 42 is swept across aperture 46 in aperture plate 44, a quantity of electrons proportional to the brightness of the image passes through aperture 46, a lead collimating plug 48, and enters into magnetic field 50 created by a bending magnet (not shown). The electron beam is deflected and impinges upon an electron detector 52 which includes scintillator 54 and photomultiplier 56. The output from photomultiplier 56 is applied through discriminator 58 to both a video display 60 and minicomputer 62 via gated analog to digital converter 61. Minicomputer 62 is connected to and controls graphic memory 64 which stores TEM image pixels for display on video display 60. The clock contained within minicomputer 62 is employed as the main timing mechanism for the system and controls the gating of A to D converter 60 via line 63. A pair of x and y sweep signals are applied to video display 60 via lines 66 and 68 from scan generator 40 and serve as synchronizing controls.

To prevent stray X rays from impacting upon and affecting the readings of electron detector 52, a radiation dump 70 is provided wherein X rays 72 are trapped. (As the X rays have no inherent charge, they are unaffected by magnetic field 50.)

Turning now to the operation of the system, scan generator 40 provides an x deflection voltage to horizontal deflection plates 36. That voltage causes beam envelope 42 to sweep in a linear horizontal fashion across aperture 46 in aperture plate 44. Plate 44 is comprised of a material which is impervious to electrons and other received energies. A typical aperture hole diameter may be approximately 50 microns, but this may be varied if it is desired to alter the somewhat conflicting requirements of good resolution (5 Angstroms at 100,000 magnification) satisfactory levels of contrast, and reasonable electron collection times. Collimating plug 48 eliminates both stray and low energy electrons which might otherwise affect the pixel quality of the system.

Electron detector 52 provides an output to discriminator 58 which is indicative of the number of electrons being counted per pixel. Discriminator 58 eliminates low level noise in the signal train. Essentially, what is being created by this sweeping and counting mechanism is the conversion of the electron image into a series of pixels (or picture elements), with each picture element having a discrete electron count indicative of its "brightness". The output from discriminator 58 is applied either as an analog voltage directly to video display 60 or via A to D converter 68 to minicomputer 62 wherein the digitized analog signal pixels are stored for further reference in graphic memory 64—which is adapted to store an entire two dimensional image. The image pixels accumulated by graphic memory 64 are used to intensity modulate a CRT contained within video display 60. Such a memory maintains the specimen's image for constant analysis without the need for continuous illumination of the specimen after the initial exposure.

It should be noted that because high gain electron multipliers are sensitive to low energy electrons and X rays, and because high energy electrons are "dirty" due to their abundant radiative processes in interacting with matter, it is essential to provide the detector housing with substantial radiation shielding to ensure that background noise is adequately eliminated and that only primary imaging electrons are registered.

This hybrid imaging scheme (i.e., a cross between transmission electron microscopy and scanning electron microscopy) eliminates the unsatisfactory features of passive detectors used in imaging (i.e., poor visibility of imaging phosphors and nonlinearity of response in photographic emulsions). It adopts an active system to detect single electrons and yield on-line electronic manipulation for direct display, contrast enhancement, recording, or direct specimen quantitation. Obviously, the rate of deflection of the image across the defining aperture must be such as to enable sufficient primary electrons to pass therethrough to provide the requisite level of contrast.

The embodiments of the invention in which an exclusive property or privilege is claimed are defined as follows:

1. In a transmission electron microscope including means for generating an electron beam of energy sufficient to illuminate but not substantially injure all or a substantial portion of a specimen to produce immediately below said specimen an instantaneous and complete image of said specimen or substantial portion thereof, the improvement comprising:

aperture defining means;

means for deflecting said complete image across said aperture defining means, at any instant said aperture defining a pixel of said image and;

electron detector means for providing, during said instant, an output indicative of the number of electrons passing through said aperture defining means as said complete image is deflected thereacross to thereby produce non-interfering pixel representations.

2. The invention as defined in claim 1, further including means responsive to the output from said electron detector means for displaying said complete image of said specimen.

3. The invention as defined in claim 2, further including means for synchronizing said deflection means with said display means.

4. The invention as defined in claim 1, wherein said microscope includes an objective lens and said deflection means are pairs of x and y deflection means located immediately below said objective lens and above subsequent microscope lenses.

5. The invention as defined in claim 1, wherein said electron detector means comprises an scintillator/photomultiplier combination which is offset from the main path of said electrons and means for deflecting said electrons to said scintillator/photomultiplier combination.

6. The invention as defined in claim 1, further including digital means, responsive to the output from said electron detector means to sample said output at predetermined times and to store the results of said sampling as pixels.

* * * * *